(12) United States Patent
Liu

(10) Patent No.: US 7,300,603 B2
(45) Date of Patent: Nov. 27, 2007

(54) CHEMICAL MECHANICAL PLANARIZATION COMPOSITIONS FOR REDUCING EROSION IN SEMICONDUCTOR WAFERS

(75) Inventor: Zhendong Liu, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 256 days.

(21) Appl. No.: 10/634,964

(22) Filed: Aug. 5, 2003

(65) Prior Publication Data

US 2005/0029491 A1   Feb. 10, 2005

(51) Int. Cl.
C09K 13/00 (2006.01)

(52) U.S. Cl. .............................. 252/79.1; 257/E21.204

(58) Field of Classification Search ............... 252/79.4, 252/79.1; 438/692–3; 216/88–9
See application file for complete search history.

(56) References Cited

U.S. PATENT DOCUMENTS

| 5,391,258 | A | | 2/1995 | Brancaleoni et al. |
| 5,858,813 | A | * | 1/1999 | Scherber et al. ............. 438/693 |
| 6,375,545 | B1 | * | 4/2002 | Yano et al. .................... 451/36 |
| 6,709,316 | B1 | * | 3/2004 | Sun et al. ..................... 451/41 |
| 2002/0197937 | A1 | | 12/2002 | Economikos et al. |
| 2003/0124959 | A1 | | 7/2003 | Chamberlain et al. |
| 2004/0147118 | A1 | | 7/2004 | Liu et al. |
| 2005/0031789 | A1 | | 2/2005 | Liu et al. |

FOREIGN PATENT DOCUMENTS

| EP | 1 081 200 A | 3/2001 |
| EP | 1 137 056 A1 | 9/2001 |
| EP | 1 150 341 A1 | 10/2001 |
| EP | 1 223 609 A1 | 7/2002 |

OTHER PUBLICATIONS

Changzhou Kejia Chemical Co. (Product Detail Poly (Maleic Acid), date unknown.*
Wikipedia: Maleic Acid (http://www.echinachem.com/kejiachem.co/Product_Detail.aspx?Gold_Product_Profile_ID=404), unknown date.*
Colloidal Dynamics; The CMP Slurry Monitor, 2000.*

* cited by examiner

*Primary Examiner*—Nadine Norton
*Assistant Examiner*—Patricia A. George
(74) *Attorney, Agent, or Firm*—Blake T. Biederman

(57) ABSTRACT

An aqueous chemical mechanical planarizing composition includes an oxidizer for promoting barrier removal and an abrasive. Inhibitor decreases removals of a metal interconnect. The composition has a carboxylic acid polymer having at least one repeat unit of the polymer comprising at least two carboxylic acid functionalities, a pH of less than or equal to 4 and a tantalum nitride removal rate of at least eighty percent of copper removal rate at a pad pressure of 13.8 kPa.

5 Claims, 3 Drawing Sheets

CHEMICAL MECHANICAL PLANARIZATION COMPOSITIONS FOR REDUCING EROSION IN SEMICONDUCTOR WAFERS

BACKGROUND OF THE INVENTION

This disclosure relates to chemical mechanical planarization (CMP) of semiconductor wafers and more particularly, to CMP (polishing) compositions and methods for removing barrier materials of semiconductor wafers in the presence of underlying dielectric layers with reduced erosion of the dielectric layer.

The semiconductor industry relies upon metal interconnect metals in forming integrated circuits on semiconductor wafers. These interconnect metals, such as aluminum, copper, gold, nickel, and platinum group metals, silver, tungsten and their alloys have a low electrical resistivity. Copper metal interconnects provide excellent conductivity at a low cost. Because copper is highly soluble in many dielectric materials, such as silicon dioxide or doped versions of silicon dioxide, integrated circuit fabricators typically apply a diffusion barrier layer to prevent the copper diffusion into the dielectric layer. For example, barrier layers for protecting dielectrics include, tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides.

Chip manufacturing uses CMP processes to planarize semiconductor substrates after the deposition of the metal interconnect layers. Typically, the polishing process uses a "first-step" slurry specifically designed to rapidly remove the metal interconnect. Then the CMP process includes a "second-step" slurry to remove the barrier layer. Typically, the second-step slurries selectively remove the barrier layer without adversely impacting the physical structure or electrical properties of the interconnect structure. In addition to this, the second step slurry should also possess low erosion rates for dielectrics. Erosion refers to unwanted recesses in the surface of dielectric layers that results from removing some of the dielectric layer during the CMP process. Erosion that occurs adjacent to the metal in trenches causes dimensional defects in the circuit interconnects. These defects contribute to attenuation of electrical signals transmitted by the circuit interconnects and impair subsequent fabrication. The removal rate of the barrier versus the removal rate of the metal interconnect or the dielectric layer is known as the selectivity ratio. For purposes of this specification removal rate refers to a removal rate as change of thickness per unit time, such as, Angstroms per minute.

Typical barrier removal CMP compositions require a high abrasive concentration, such as at least 7.5 weight percent, in a fluid CMP composition to remove a barrier material. These high-abrasive slurries, however, tend to result in unacceptable dielectric erosion rates. In addition to this, high abrasive concentrations can result in peeling or delaminating of low-k dielectric layers from semiconductor wafers. Furthermore, the peeling or delaminating of low-k dielectrics becomes a greater problem at pressures of 21.7 kPa (3 psi) and above.

EP1150341 to Uchida et al. teaches a CMP composition for use in CMP processes, comprising an oxidizing agent, an oxidized metal etchant, abrasives, a protective film-forming agent, which comprises a carboxylic acid polymer and a dissolution promotor. This composition is designed for first-step copper removal; and it does not effectively remove a barrier layer while reducing erosion.

There remains an unsatisfied demand for aqueous CMP compositions that can selectively remove tantalum barrier layers while simultaneously reducing erosion of dielectric materials. In addition there is a demand for a CMP composition that removes barrier layers from patterned wafers with decreased defectivity rates.

STATEMENT OF THE INVENTION

The invention provides an aqueous chemical mechanical planarizing composition comprising: an oxidizer for promoting barrier removal; an abrasive; an inhibitor for decreasing removal of a metal interconnect; and a carboxylic acid polymer having at least one repeat unit of the polymer comprising at least two carboxylic acid functionalities and wherein the chemical mechanical planarizing composition has a pH of less than or equal to 4 and a tantalum nitride removal rate of at least eighty percent of copper removal rate at a pad pressure of 13.8 kPa.

In addition, the invention includes a method for planarizing a semiconductor wafer comprising: applying an aqueous chemical mechanical planarizing composition to the wafer, wherein the composition comprises a carboxylic acid polymer having at least one repeat unit of the polymer comprising at least two carboxylic acid functionalities; an abrasive; and a corrosion inhibitor for limiting removal of the interconnect metal, wherein the chemical mechanical planarizing composition has a pH of less than or equal to 4; and polishing the semiconductor wafer, wherein the chemical mechanical planarizing composition has a tantalum nitride removal rate of at least eighty percent of copper removal rate at a pad pressure of 13.8 kPa.

DETAILED DESCRIPTION

Figure 1:
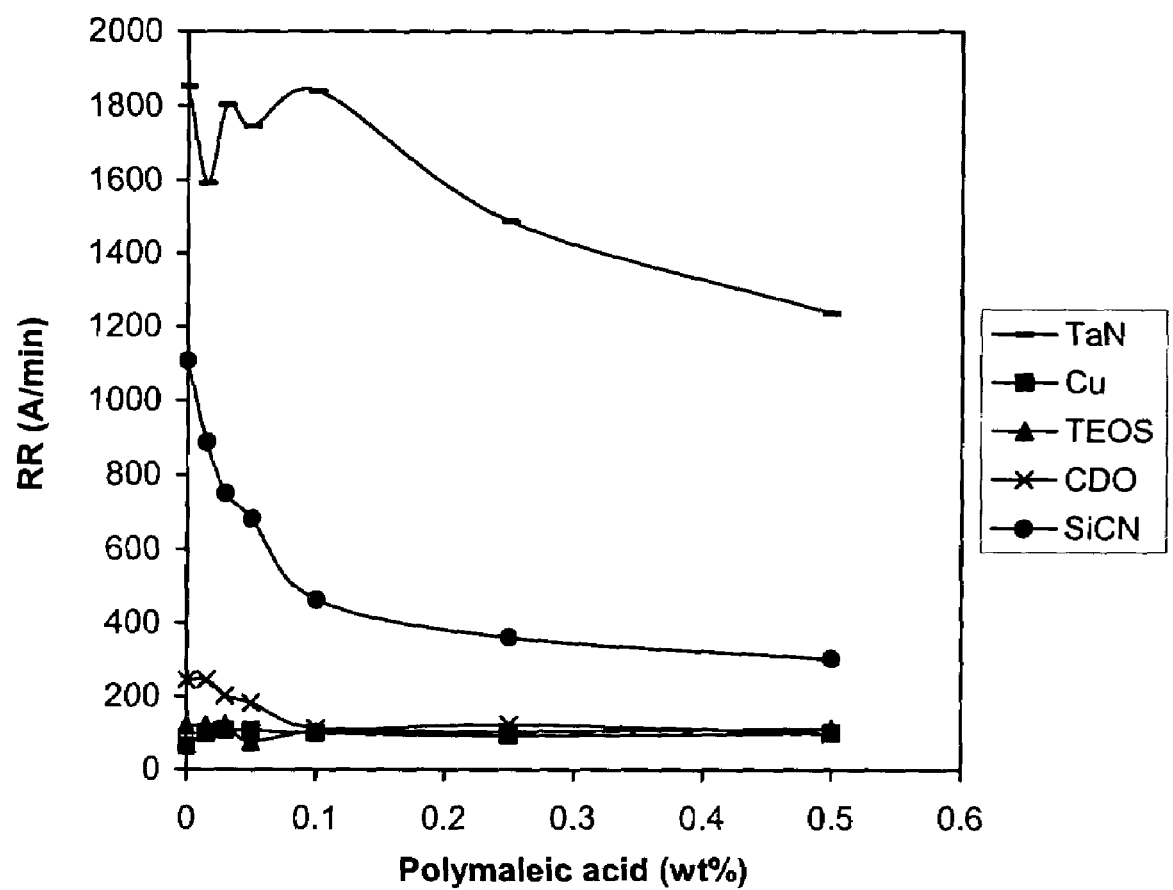
FIG. 1 is a graphical representation of the removal rate for the barrier, interconnect metal and dielectric layers versus the concentration of polymaleic acid in weight percent.

The CMP composition is suitable for barrier removal in the manufacture of a wide variety of semiconductor wafers with reduced erosion rates for dielectric materials. The chemical mechanical planarizing composition includes carboxylic acid polymers that operate at an acidic pH of less than 4 and reduce erosion for dielectric materials. In particular, the carboxylic acid polymers have at least one of their repeat units of the polymer has at least two carboxylic acid functionalities. This CMP composition removes barrier layers with reduced dielectric erosion and a controlled copper removal rate. Typical dielectric materials used in integrated circuits include: silica-containing materials derived from silanes such as tetratethylorthosilicate (TEOS), low k and/or ultra-low k organic materials, CORALS® CVD SiOC commercially available from Novellus, BLACK DIAMONDS® CVD SiOC commercially available from Applied Materials, dense SiLK® spin-on dielectric and porous SiLK® spin-on dielectric commercially available from Dow Chemicals, ZIRKON® spin-on porous SiOC commercially available from Shipley, AURORA® CVD SiOC commercially available from ASML and TEFLON® polytetrafluoroethylene commercially available from DuPont.

The carboxylic acid polymers used in the CMP composition are preferably water soluble. The carboxylic acid polymer is preferably the polymerization product of at least one carboxylic acid monomer having ethylenic unsaturation with at least one carboxylic acid group in the form of a free acid or an acid salt. Example salts include alkaline earth metals and alkali metal salts.

In one embodiment, the carboxylic acid polymer consists of the polymerization product of at least one carboxylic acid monomer having at least two carboxylic acid functionalities without the presence of other comonomers i.e., the carboxylic acid polymer is a homopolymer. In another embodiment, the carboxylic acid polymer consists of the copolymerization product of at least one carboxylic acid monomer having at least two carboxylic acid functionalities with at least one copolymerizable monomer or copolymerizable polymer. For purposes of this specification, copolymers include polymers formed from two or more monomers. Suitable copolymerizable monomers include, for example, olefinic monomers, styrenic monomers, vinyl chloride monomers, vinylidene chloride monomers, acrylonitrile monomers and mixtures comprising at least one of the foregoing copolymerizable monomers. Suitable copolymerizable polymers include, for example, polyesters, polycarbonates, polyamides, polyolefins, polystyrenes, polyacetals, polyacrylics, polycarbonates, polyamideimides, polyarylates, polyurethanes, polyarylsulfones, polyethersulfones, polyarylene sulfides, polyvinyl chlorides, polysulfones, polyetherimides, polytetrafluoroethylenes, polyetherketones, polyether etherketones and mixtures comprising at least one of the foregoing polymers. It is to be noted that when the carboxylic acid polymer is the copolymerization product of at least one carboxylic acid monomer with at least one copolymerizable monomer or copolymerizable polymer, the resulting carboxylic acid is still water soluble.

In an exemplary embodiment, the carboxylic acid polymer may have at least one carboxylic acid functional group as a substituent on the polymer chain backbone in addition to the carboxylic acid functionalities present in the chain backbone. The carboxylic acid polymer may therefore have carboxylic acid functional groups present in both the polymer chain backbone as well as a substituent on the polymer chain backbone.

It is desirable to use carboxylic acid polymers having a number average molecular weight ($M_n$) of 200 to 2,000,000 grams/mole (g/gmole). Within this range it is desirable to use carboxylic acid polymers having an $M_n$ of greater than or equal to 400 g/gmole. Also desirable within this range is an $M_n$ of less than or equal to 100,000 g/gmole, preferably less than or equal to 50,000 g/gmole. For purposes of this specification, the molecular weight is determined by gel permeation chromatography.

It is desirable to use the carboxylic acid polymer in an amount of 0.01 to 5 weight percent (wt %). For purpose of this specification all weight percents are determined with respect to the total weight of the CMP composition unless otherwise stated. Within this range it is desirable to use an amount of greater than or equal to 0.05, preferably greater than or equal to 0.1 wt %. Also desirable within this range is an amount of less than or equal to 3, preferably less than or equal to 2 wt %.

Suitable carboxylic acid polymers include, for example, polyaspartic acid, polyglutamic acid, polylysine, polymalic acid, polymethacrylic acid, ammonium polymethacrylate, sodium polymethacrylate, polyamic acid, polymaleic acid, polyitaconic acid, polyfumaric acid, poly(p-styrenecarboxylic acid), polyacrylic acid, polyacrylamide, aminopolyacrylamide, ammonium polyacrylate, sodium polyacrylate, polyamic acid, ammonium polyamide, sodium polyamide, polyglyoxylic acid and mixtures comprising at least one of the foregoing polymers.

The preferred carboxylic acid polymer is polymaleic acid having the structure shown in formula (I) below.

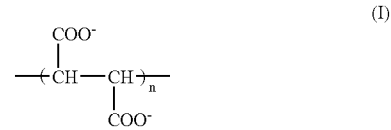

(I)

A preferred commercially available polymaleic acid is Optidose 4210 commercially available from Rohm and Haas. Polymaleic acid is stable at all pH levels and does not precipitate during formulation. Optionally, the polymaleic acid can be partially or fully neutralized. Suitable ions for neutralization are ammonium ions, alkaline earth metals or alkali metals, which include, for example, lithium, sodium, potassium, rubidium, cesium, magnesium, calcium and mixtures comprising at least one of the foregoing ions. The CMP compositions containing these carboxylic acid polymers reduce dielectric material erosion rates while maintaining barrier removal rate.

The CMP composition includes an abrasive for "mechanical" removal of barrier layers. The abrasive is preferably a colloidal abrasive. Example abrasives include the following: inorganic oxide, metal boride, metal carbide, metal nitride, or a combination comprising at least one of the foregoing abrasives. Suitable inorganic oxides include, for example, silica ($SiO_2$), alumina ($Al_2O_3$), zirconia ($ZrO_2$), ceria ($CeO_2$), manganese oxide ($MnO_2$), and mixtures comprising at least one of the foregoing abrasive oxides. Modified forms of these inorganic oxides such as polymer-coated inorganic oxide particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, and mixtures comprising at least one of the foregoing metal carbides, boride and nitrides. Diamond may also be utilized as an abrasive if desired. Alternative abrasives also include polymeric particles and coated polymeric particles. The preferred abrasive is silica.

It is desired to use the abrasive in an amount of 0.05 wt % to 15 wt %. Within this range, it is desirable to have the abrasive present in an amount of greater than or equal to 0.1, and preferably greater than or equal to 0.5 wt %. Also desirable within this range is an amount of less than or equal to 10, and preferably less than or equal to 5 wt %.

The abrasive has an average particle size of less than or equal to 150 nanometers (nm) for preventing excessive metal dishing and dielectric erosion. For purposes of this specification, particle size refers to the average particle size of the abrasive. It is desirable to use an abrasive having an average particle size of less than or equal to 100 nm, preferably less than or equal to 75 nm and preferably less than or equal to 50 nm. The least dielectric erosion and metal dishing advantageously occurs with silica having an average particle size of less than or equal to 50 nm. In addition, the preferred abrasive may include additives, such as dispersants to improve the stability of the abrasive at acidic pH ranges. One such abrasive is colloidal silica from Clariant S. A., of Puteaux, France.

When the abrasive particle size is less than or equal to 50 nm, it has been discovered that the CMP composition can advantageously remove the barrier layer at a high rate, while at the same time reducing erosion to the low k and ultra-low k dielectric layers. The CMP compositions also demonstrate that decreasing the particle sizes in the composition produces a substantial decrease in both the dishing and the erosion of the dielectric layers. In another embodiment, for CMP compositions having abrasive average particle sizes less than or equal to 50 nm, the particle size distribution may at least be unimodal. The particle size distribution may also be bimodal or trimodal if desired.

If the CMP composition does not contain abrasives, then pad selection and conditioning becomes more important to the chemical mechanical planarizing (CMP) process. For example, for some silica-free compositions a fixed abrasive pad improves polishing performance.

The removal rate of barrier layers, such as tantalum and tantalum nitride is advantageously optimized by the use of the oxidizing agent. Suitable oxidizers include, for example, hydrogen peroxide, monopersulfates, iodates, magnesium perphthalate, peracetic acid and other peracids, persulfates, bromates, periodates, nitrates, iron salts, cerium salts, manganese (Mn) (III), Mn (IV) and Mn (VI) salts, silver salts, copper salts, chromium salts, cobalt salts, halogens, hypochlorites, and mixtures comprising at least one of the foregoing oxidizers. The preferred oxidizer is hydrogen peroxide. It is to be noted that the oxidizer is occasionally added to the CMP composition just prior to use and in such instances the oxidizer is contained in a separate package. The oxidizer addition is preferably 0.1 to 10 wt %. Within this range, it is most preferable to use an amount of 0.2 to 5 wt %.

The CMP composition has an acidic pH to produce a high barrier removal rate while reducing the erosion of the dielectric layer. Suitable metals used for the interconnect include, for example, aluminum, aluminum alloys, copper, copper alloys, gold, gold alloys, nickel, nickel alloys, platinum group metals, platinum group alloys, silver, silver alloys, tungsten and tungsten alloys or combinations comprising at least one of the foregoing metals. The preferred interconnect metal is copper. In acidic CMP compositions and slurries that utilize oxidizers such as hydrogen peroxide, both the copper removal rate and the static etch rate are high primarily because of oxidation of the copper. In order to reduce the removal rate of the interconnect metal the CMP composition employs a primary corrosion inhibitor and an optional secondary corrosion inhibitor. The corrosion inhibitors function to reduce oxidation of the interconnect metal by the oxidizing agent. This facilitates improved polishing performance by reducing the dishing of the interconnect metal.

The preferred corrosion inhibitor is benzotriazole (BTA). In one embodiment, the CMP composition may contain a relatively large quantity of BTA inhibitor for reducing the interconnect removal rate. The inhibitor is present in an amount of 0.0025 to 6 wt %. Within this range, it is desirable to have an amount of inhibitor greater than or equal to 0.025, preferably greater than or equal to 0.25 wt %. Also desirable within this range is an amount of less than or equal to 4, preferably less than or equal to 1 wt %. When BTA is used, it can be used up to the limit of solubility concentration in the CMP composition, which may be up to about 2 wt % or the saturation limit in the CMP composition. The preferred concentration of BTA is an amount of 0.0025 to 2 wt %. Optionally, a supplementary corrosion inhibitor may be added to the CMP composition. Supplementary corrosion inhibitors are surfactants such as, for example, anionic surfactants, nonionic surfactants, amphoteric surfactants and polymers, or organic compounds such as azoles. For example, the supplementary inhibitor may include an imidazole, tolytriazole or a mixture thereof in combination with BTA. The most preferred supplementary corrosion inhibitor is tolytriazole in combination with BTA.

The CMP composition also includes an inorganic or an organic pH adjusting agent to reduce the pH of the CMP composition to an acidic pH less than or equal to 4. Suitable inorganic pH adjusting agents include, for example, nitric acid, sulfuric acid, hydrochloric acid, phosphoric acid, and mixtures comprising at least one of the foregoing inorganic pH adjusting agents. The preferred pH adjusting agent is nitric acid ($HNO_3$).

It is desirable to have the pH of the CMP composition less than or equal to 4. Within this range it is desirable to have a pH of greater than or equal to 1, preferably greater than or equal to 1.5. Also desirable within this range is a pH of less than or equal to 3.5, preferably less than or equal to 3. The preferred pH range is 1 to 4 for the CMP composition; and the most preferred pH for the CMP composition is 2 to 3.

At a pH below 3, the CMP composition can provide a high barrier metal removal rate accompanied by a reduced erosion rate, even with a relatively low weight percent of abrasive in the CMP composition. This low abrasive concentration can improve the polishing performance of a CMP process by reducing undesired abrasive induced defects, such as scratching. For example, a particle size of as small as approximately 10 nm still provides an acceptable barrier layer removal rate while reducing erosion of the dielectric layer. By employing an abrasive having a relatively small particle size and formulating the CMP composition at a low abrasive concentration, erosion of the dielectric layer can be further reduced.

Optionally, the CMP composition may contain a chelating or complexing agent to adjust the copper removal rate relative to the barrier metal removal rate. The chelating or complexing agent improves the copper removal rate by forming a chelated metal complex with copper. Suitable chelating agents include, for example, carboxylic acid, an amino-carboxylic acid and derivatives thereof, and mixtures comprising at least one of the foregoing chelating agents. Preferably, the chelating agent is present in the CMP composition in an amount of less than or equal to 2 wt %, based on the total weight of the CMP composition. Optionally, the CMP composition can also include buffering agents such as various organic and inorganic acids, and amino acids or their salts with a pKa in the pH range of 1.5 to less than 3. Optionally, the CMP composition can further include defoaming agents, such as non-ionic surfactants including esters, ethylene oxides, alcohols, ethoxylate, silicon compounds, fluorine compounds, ethers, glycosides and their derivatives, and mixtures comprising at least one of the foregoing surfactants. The defoaming agent may also be an amphoteric surfactant. The chemical mechanical planarizing composition can also optionally include pH buffers, biocides and defoaming agents.

The CMP composition enables the CMP apparatus to operate with a low pressure of less than 21.7 kPa (3 psi). The preferred pad pressure is 3.5 to 21.7 kPa (0.5 to 3 (psi)). Within this range, a pressure of less than or equal to 13.8 kPa (2 psi), more preferably less than or equal to 10.3 kPa (1.5 psi), and most preferably less than or equal to about 6.9 kPa (1 psi) may be advantageously used. The low CMP pad pressure improves polishing performance by reducing scratching and other undesired polishing defects and reduces damage to fragile materials. For example, low dielectric constant materials fracture and delaminate when exposed to high stresses. The CMP compositions containing the multi-functional acid carboxylic acid polymers advantageously permit high barrier and copper removal rates while reducing the erosion to the low k and ultra-low k dielectric layers derived from organic materials. In an exemplary embodiment, the CMP composition can be adjusted or tuned so as to advantageously achieve a high barrier removal rate without substantial damage to the low k or ultra-low k dielectric layer. The CMP compositions can be advantageously used to reduce erosion in patterned wafers having a variety of line widths.

The CMP composition has a tantalum nitride removal rate of at least eighty percent of the copper removal rate at a pad pressure of 13.8 kPa as measured with a polishing pad pressure measured normal to an integrated circuit wafer and using a porous-filled polyurethane polishing pad. A particular polishing pad useful for determining selectivity is the IC1010™ porous-filled polyurethane polishing pad. Preferably, CMP composition has a tantalum nitride removal rate of at least eighty percent of the copper removal rate at a pad pressure of 13.78 kPa as measured with a polishing pad pressure measured normal to an integrated circuit wafer and using a porous-filled polyurethane polishing pad. Furthermore, the CMP composition is capable of having tantalum nitride removal rates three or five times greater than the copper removal rate.

Some embodiments of the invention will now be described in detail in the following Examples.

EXAMPLE 1

The nomenclature for the materials used in the CMP compositions for the following examples are shown in Table 1 below. The Klebosol PL150H25 is a silica available from Clariant, having 30 wt % silica particles of average size equal to 25 nm and a pH of 2 to 3. The sample is diluted down to 4 wt % silica particles by using water.

TABLE 1

| Nomenclature | Name |
| --- | --- |
| BTA | benzotriazole |
| Klebosol PL150H25 | colloidal silica |
| $H_2O_2$ | hydrogen peroxide |
| Polymaleic acid | carboxylic acid polymer having two carboxylic acid functionalities per repeat unit |

This experiment was conducted to determine the polishing performance of the CMP composition at varying component concentrations. Polishing experiments were performed using a 6EC model polishing equipment supplied by Strasbaugh. The polishing pad was an IC1010™ supplied by Rodel, Inc. The pad was conditioned prior to each run. The polishing process was performed at a pressure of 6.9 kPa (1 psi), a table speed of 120 revolutions per minute (rpm) and a carrier speed of 114 rpm. The CMP composition supply rate (slurry flow rate) was 200 milliliters/minute (ml/min).

In this example, several slurries were prepared with different polymaleic acid concentrations as shown in Table 1. All the above compositions have 4 wt % Klebosol PL150H25, 0.6 wt % BTA, 0.5 wt % $H_2O_2$ and a solution pH of 2.5. Comparative examples are denoted by letters, while the examples of the CMP composition are denoted by numbers. Table 2 shows removal rates (RR) for tantalum nitride (TaN), copper (Cu), TEOS, CDO and SiCN in Angstroms/minute.

TABLE 2

| Composition | Polymaleic acid (wt %) | TaN RR | Cu RR | TEOS RR | CDO RR | SiCN RR |
| --- | --- | --- | --- | --- | --- | --- |
| A | 0 | 1853 | 66 | 120 | 246 | 1108 |
| 1 | 0.015 | 1592 | 99 | 123 | 247 | 889 |
| 2 | 0.03 | 1803 | 109 | 123 | 202 | 751 |
| 3 | 0.05 | 1745 | 107 | 76 | 182 | 682 |
| 4 | 0.1 | 1840 | 100 | 104 | 113 | 463 |
| 5 | 0.25 | 1487 | 94 | 105 | 123 | 361 |
| 6 | 0.5 | 1236 | 100 | 111 | 100 | 303 |

The results of Table 2 are plotted in FIG. 1. The FIG. 1 is a graphical representation of the removal rate barrier and dielectric layers versus the concentration of Polymalic acid in weight percent and shows that the polymaleic acid does not significantly affect the TaN copper and TEOS removal rates at concentrations of less than or equal to 0.1 wt. %. It does however, decrease the CDO and SiCN removal rates at concentrations of less than or equal to 0.1 wt %.

Various CMP compositions from Table 2 were used to determine the polishing performance on a pattern wafer having patterns of various line widths and densities (referred to as structures) as seen in Table 3 below. Table 3 reflects line widths and spacing between lines on an 854 TEOS pattern wafer.

TABLE 3

| Nomenclature for structures (Line Width/Space) | Density |
| --- | --- |
| 100 μm/100 μm | 50% |
| 50 μm/50 μm | 50% |
| 10 μm/10 μm | 50% |
| 7 μm/3 μm | 70% |
| 0.25 μm/0.25 μm | 50% |
| 9 μm/1 μm | 90% |

EXAMPLE 2

In Table 4, comparative composition A from Table 2 was used to polish a 854 TEOS patterned wafer having patterned line widths and spacing as described in Table 3. Readings were taken in the center of the pattern (center die), middle of the pattern (middle die) and edge of the pattern (edge die). The readings at the center, middle and edge were then averaged and reported in the Table 4. The data for the 100 μm /100 μm, 50 μm /50 μm and 10 μm /10 μm structures reflect the dishing, while the data for the 7 μm /3 μm, 9 μm /1 μm and 0.25 μm /0.25 μm structures reflect the interlayer dielectric erosion. This experiment was conducted to determine the polishing performance of the CMP composition at varying component concentrations. Polishing experiments were performed using a Mirra polishing device supplied by Applied Materials. The polishing pad was an IC1010™ supplied by Rodel, Inc. The pad was conditioned prior to each run. The polishing process was performed at a pressure of 6.9 kPa (1 psi), a table speed of 120 revolutions per minute (rpm) and a carrier speed of 114 rpm. The CMP composition supply rate (slurry flow rate) was 200 milliliters/minute (m/min).

The values shown in Table 4 represent the topographic depth in Angstroms.

TABLE 4

| | Dishing 100 μm/ 100 μm structure | Dishing 50 μm/ 50 μm structure | Dishing 10 μm/ 10 μm structure | Erosion 7 μm/ 3 μm structure | Erosion 9 μm/ 1 μm structure | Erosion 0.25 μm/ 0.25 μm structure |
|---|---|---|---|---|---|---|
| Comparative composition A | 216 | 216 | 233 | 350 | 550 | 416 |
| Composition 4 | −33 | −100 | 258 | 100 | 366 | −33 |

The data shown in the Table 4 demonstrate that the composition 4 containing the 0.1 wt % polymaleic acid improves erosion performance on patterned structures. The benefit was most significant for the 0.25 μm /0.25 μm structure and the 7 μm /3 μm structure. The negative results shown for the composition 4 indicate copper protrusions above the planarization surface.

EXAMPLE 3

Figure 2:
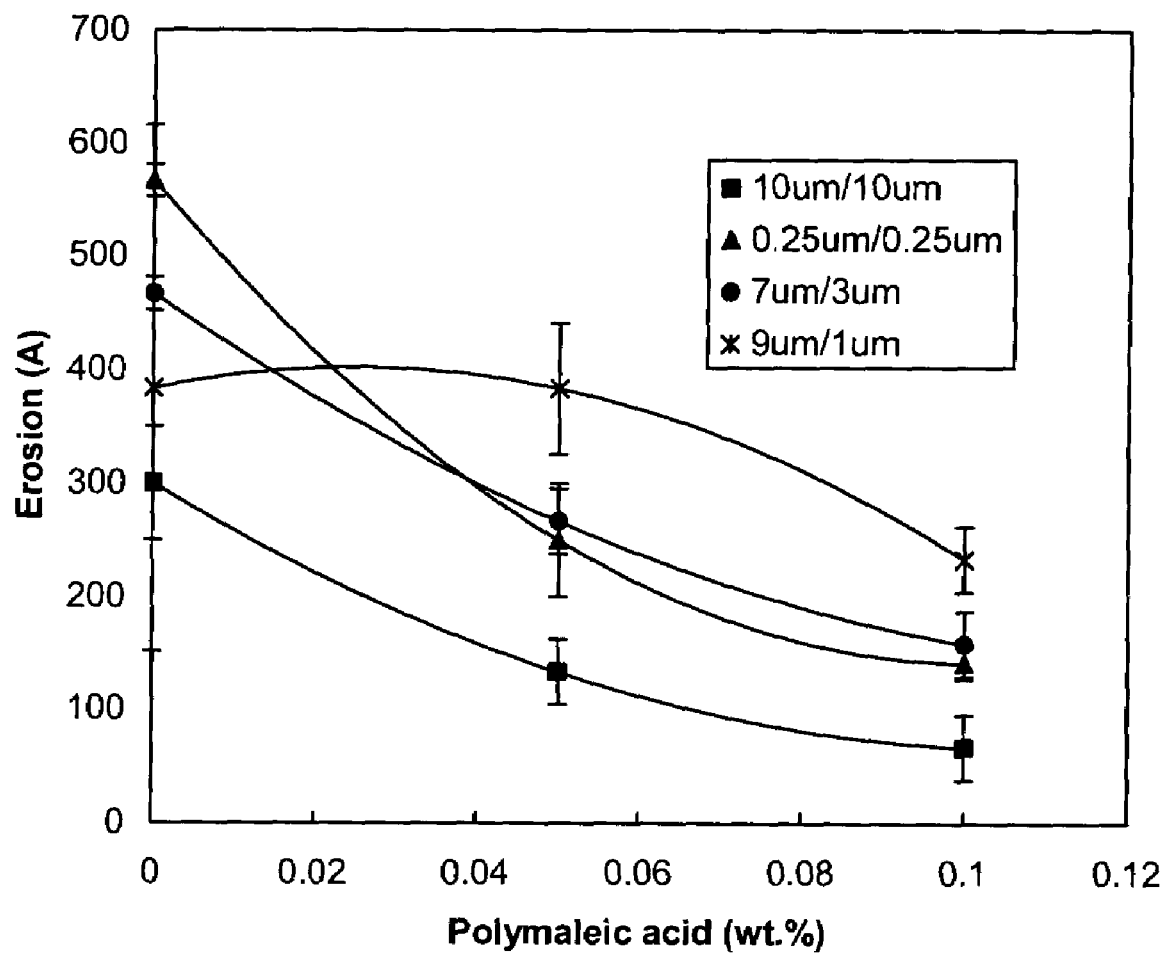
FIG. 2 is a graphical representation of erosion at 10 µm/10 µm, 0.25 µm/0.25 µm, 7 µm/3 µm and 9 µm/1 µm features versus the concentration of polymaleic acid in weight percent.

Using the polishing conditions of Example 2, the above pattern wafer test was repeated with the addition of composition 3. The data are plotted in FIG. 2, showing the erosion of 10 μm /10 μm, 0.25 μm/0.25 μm, 7 μm/3 μm and 9 μm/1 μm features. Again, it confirms that polymaleic acid improves the erosion performance significantly.

From these experiments it can be seen that the CMP compositions containing the carboxylic acid polymer, polymaleic acid, do not affect or reduce the barrier removal rate, while simultaneously reducing damage in the form of erosion to the low k or ultra-low k dielectric layers. The CMP compositions can advantageously operate at low pad pressures of 6.9 kPa (1 psi) and can be used in high topography integrated circuit devices to reduce erosion, while maintaining a high barrier removal rate.

The CMP compositions also demonstrate that decreasing the abrasive particles size in the composition produces a substantial decrease in both the dishing and the erosion of the dielectric layers. Thus the abrasive particles having an average particle size of less than or equal to 9 nm, offers the best dishing and erosion performance. Even though the TaN removal rate decreases when the average particle size decreases from 25 to 9 nm, the removal rate is high enough for an efficient second step barrier removal CMP process.

EXAMPLE 4

The experiment was conducted on a Mirra® model polishing equipment supplied by Applied Materials. The polishing pad was an IC1010™ supplied by Rodel, Inc. The pad was conditioned prior to each run. The polishing process was performed at a pressure of 10.3 kPa (1.5 psi), a table speed of 93 revolutions per minute (rpm) and a carrier speed of 87 rpm. The CMP composition supply rate (slurry flow rate) was 200 milliliters/minute (ml/min). The copper sheet wafers for the defectivity test were first pre-polished by a commercially available slurry EPL2362 (manufactured by Ethemal Chemical Co., Ltd.) for 1 minute using a CUP4410 pad (supplied by Rodel, Inc.) and process parameters of 21.7 kPa (3 psi), 93 rpm table speed, 87 rpm carrier speed and 200 ml/min slurry flow rate. This step is to create a fresh copper surface. Then the pre-polished copper sheet wafer was polished by the slurry composition 4 and a conventional alkaline slurry.

Figure 3:
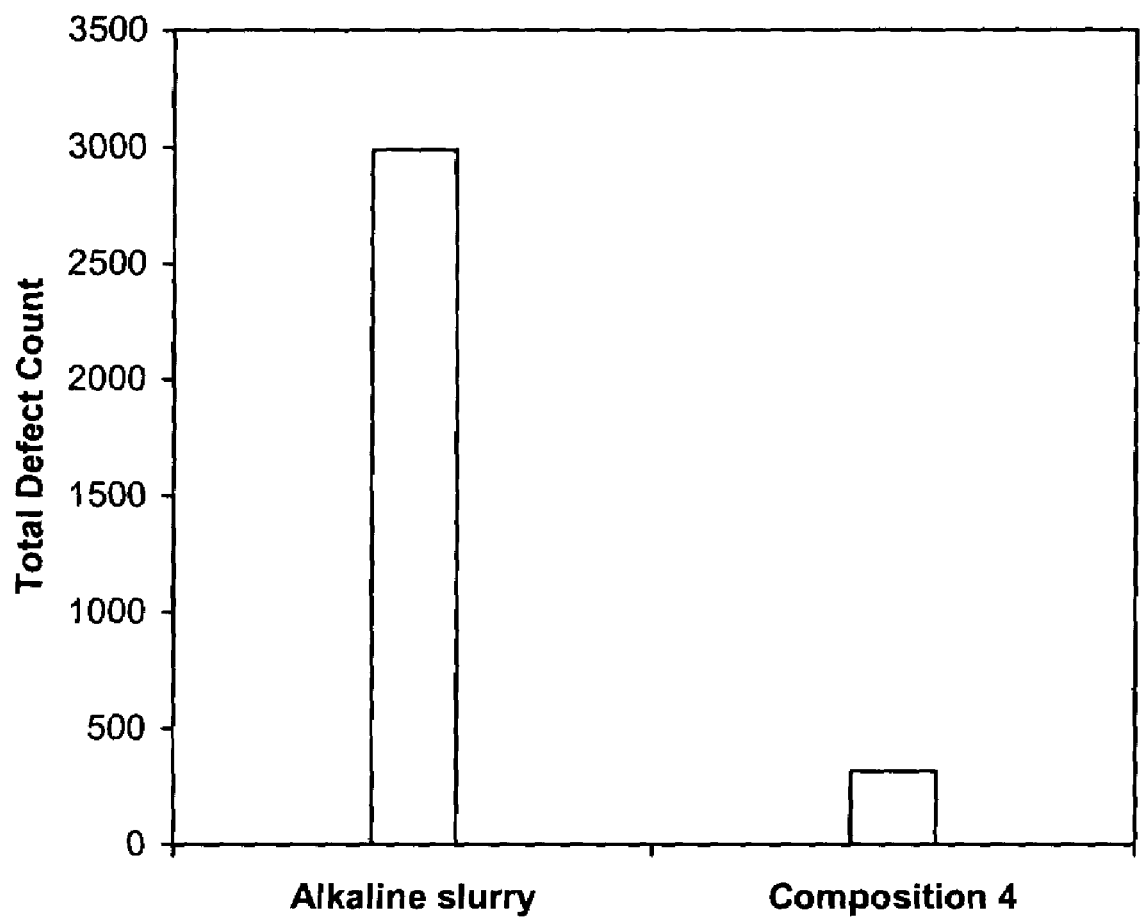
FIG. 3 is a defectivity comparison on copper sheet wafers between an alkaline slurry and an acidic slurry containing a carboxylic acid polymer.

After polishing, the defectivity counts were measured on an Orbot® defectivity tool manufactured by Applied Materials. The conventional alkaline slurry had 2,989 total defects; and the composition 4 had 314 total defects. As illustrated in FIG. 3, the acidic second step barrier polishing composition offers significant defectivity improvement over conventional high abrasive-containing alkaline barrier slurries.

The chemical mechanical planarization compositions selectively remove tantalum barrier layers while simultaneously reducing erosion of dielectric materials. In addition, it is possible to adjust or tune this composition to control barrier removal rate, interconnect removal rate and dielectric removal rate. Factors for controlling the barrier removal rate include average particle size, particle concentration, pH and oxidizer concentration. Factors for controlling interconnect metal removal rate include inhibitor concentration, average particle size, particle concentration and oxidizer concentration. In addition, factors for adjusting dielectric removal rate include carboxylic acid polymer type, carboxylic acid polymer concentration, average particle size and particle concentration. Adjusting the above factors provides a CMP composition that facilitates simplified barrier and interconnect metal removal rate adjustment for multiple integration schemes.

I claim:

1. An aqueous chemical mechanical planarizing composition comprising:
   an oxidizer for promoting barrier removal;
   an abrasive;
   an inhibitor for decreasing removal of a metal interconnect; and
   water soluble polymaleic acid and wherein the chemical mechanical planarizing composition has a pH of less than 4 adjusted with an inorganic pH adjusting agent, the inorganic pH adjusting agent being an acid; and a tantalum nitride removal rate of at least eighty percent of copper removal rate at a pad pressure of 13.8 kPa.

2. The composition of claim 1, wherein the polymaleic acid comprises a homopolymer or a copolymer.

3. The composition of claim 1, having a pH of 1.5 to less than 4.

4. An aqueous chemical mechanical planarizing composition comprising:
   0.05 to 15 wt % abrasive;
   0.1 to 10 wt % oxidizing agent;
   0.0025 to 2 wt % of benzotriazole; and
   0.01 to 5 wt % of water soluble polymaleic acid, and wherein the pH of the chemical mechanical planarizing composition is less than 4 adjusted with an inorganic pH adjusting agent, the inorganic pH adjusting agent including an acid selected from nitric acid, sulfuric acid, hydrochloric acid and phosphoric acid; and a tantalum nitride removal rate of at least eighty percent of copper removal rate at a pad pressure of 13.8 kPa.

5. The composition of claim 4, wherein the polymaleic acid comprises a homopolymer or a copolymer.

* * * * *